US009153508B2

(12) United States Patent
Partsch

(10) Patent No.: US 9,153,508 B2
(45) Date of Patent: Oct. 6, 2015

(54) MULTI-CHIP PACKAGE AND INTERPOSER WITH SIGNAL LINE COMPRESSION

(75) Inventor: Torsten Partsch, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 71 days.

(21) Appl. No.: 14/239,110

(22) PCT Filed: Jul. 30, 2012

(86) PCT No.: PCT/US2012/048900
§ 371 (c)(1),
(2), (4) Date: Feb. 14, 2014

(87) PCT Pub. No.: WO2013/025338
PCT Pub. Date: Feb. 21, 2013

(65) Prior Publication Data
US 2014/0197409 A1    Jul. 17, 2014

Related U.S. Application Data

(60) Provisional application No. 61/524,694, filed on Aug. 17, 2011.

(51) Int. Cl.
*H01L 23/58*     (2006.01)
*H01L 21/66*     (2006.01)
(Continued)

(52) U.S. Cl.
CPC ............... *H01L 22/32* (2013.01); *H01L 23/12* (2013.01); *H01L 25/18* (2013.01); *G01R 31/318505* (2013.01); *H01L 22/34* (2013.01); *H01L 24/13* (2013.01); *H01L 24/16* (2013.01); *H01L 25/0655* (2013.01); *H01L 25/0657* (2013.01); *H01L 2224/131* (2013.01); *H01L 2224/16225* (2013.01); *H01L 2225/06513* (2013.01); *H01L 2225/06517* (2013.01); *H01L 2225/06541* (2013.01); *H01L 2924/14* (2013.01);
(Continued)

(58) Field of Classification Search
CPC ... H01L 25/0657; H01L 25/117; H01L 22/30; H01L 22/32; H01L 22/34
USPC .................................. 257/48, 685, 686, 777
See application file for complete search history.

(56) References Cited

U.S. PATENT DOCUMENTS 5,177,594 A    1/1993  Chance et al.
5,258,648 A    11/1993 Lin
(Continued)

FOREIGN PATENT DOCUMENTS

EP    0312217    4/1989

OTHER PUBLICATIONS

"Silicon on Insulator," dated Jul. 10, 2011, http://en.wikipedia.org/wiki/Silicon on insulator. 4 pages.
(Continued)

*Primary Examiner* — Minh-Loan Tran
(74) *Attorney, Agent, or Firm* — Fenwick & West LLP

(57) ABSTRACT

A multi-chip package with signal line compression for testing of the multi-chip package. The multi-chip package includes an interposer and two or more integrated circuits attached to the interposer. The interposer includes multiple data signal lines for data communications between the two integrated circuits. The data signal lines are also coupled to one or more test contacts through an interface circuit. The number of test contacts is smaller than the number of signal lines, which allows a large number of signal lines to be tested with a smaller number of test contacts.

20 Claims, 7 Drawing Sheets

(51) Int. Cl.
*H01L 25/18* (2006.01)
*H01L 23/12* (2006.01)
*G01R 31/3185* (2006.01)
*H01L 23/00* (2006.01)
*H01L 25/065* (2006.01)

(52) U.S. Cl.
CPC . *H01L2924/1431* (2013.01); *H01L 2924/1433* (2013.01); *H01L 2924/1434* (2013.01); *H01L 2924/157* (2013.01); *H01L 2924/15192* (2013.01); *H01L 2924/15788* (2013.01)

(56) References Cited

U.S. PATENT DOCUMENTS

| | | | |
|---|---|---|---|
| 5,327,013 | A | 7/1994 | Moore et al. |
| 5,355,283 | A | 10/1994 | Marrs et al. |
| 5,517,515 | A | 5/1996 | Spall et al. |
| 5,703,400 | A | 12/1997 | Wojnarowski et al. |
| 5,717,245 | A | 2/1998 | Pedder |
| 5,770,477 | A | 6/1998 | Brandenburg |
| 5,840,417 | A | 11/1998 | Bolger |
| 5,854,534 | A | 12/1998 | Beilin et al. |
| 6,022,758 | A | 2/2000 | Badehi |
| 6,052,287 | A | 4/2000 | Palmer et al. |
| 6,221,753 | B1 | 4/2001 | Seyyedy |
| 6,643,434 | B2 | 11/2003 | Cayrefourcq et al. |
| 7,745,920 | B2 | 6/2010 | Lee et al. |
| 2001/0010064 | A1 | 7/2001 | Kanekawa et al. |
| 2009/0016130 | A1 | 1/2009 | Menke et al. |
| 2009/0183039 | A1 | 7/2009 | Borkenhagen et al. |
| 2009/0272974 | A1* | 11/2009 | Park et al. ................. 257/48 |
| 2010/0052767 | A1 | 3/2010 | Nate |
| 2010/0070696 | A1 | 3/2010 | Blankenship |
| 2011/0149740 | A1* | 6/2011 | Cases et al. ............... 370/241 |

OTHER PUBLICATIONS

PCT International Preliminary Report on Patentability dated Feb. 27, 2014 (Chapter I) in International Application No. PCT/US2012/048900. 5 pages.

PCT International Search Report and Written Opinion, PCT/US2012/048900, Jan. 31, 2013, 8 Pages.

EP Extended Search Report date Mar. 17, 2015 re Appln. No. 12823627.0. 6 pages.

* cited by examiner

MULTI-CHIP PACKAGE AND INTERPOSER WITH SIGNAL LINE COMPRESSION

BACKGROUND

The present disclosure relates to multi-chip packages, and more specifically a multi-chip package including an interposer that allows efficient testing of integrated circuits (IC) disposed thereon.

A common trend in modern electronics is for each new generation of devices to become increasingly smaller and lighter. One of the technologies used to meet these requirements is multi-chip packaging. A multiple chip-package or multi-chip module is an electronic package where multiple ICs or discrete components are packaged together on a unifying interposer. A multi-chip package has the advantage of integrating several different functions into a single, dense, space-saving package.

Multi-chip packages and their components may be tested at various stages in the manufacturing process to ensure proper functionality. For example. ICs may be tested by their vendors before they are attached to a multi-chip package to improve package yield. Additionally, heat stress during package assembly may introduce additional failures even if the ICs are known good parts. Thus multi-chip packages may also be tested after assembly of the package to identify failing parts. Testing can range from simple contact tests verifying that an IC is correctly attached to the interposer and that the chip I/O is functional to complex test patterns verifying full functionality of an IC (e.g., full memory array test of a memory chip). The contact tests for verifying proper connectivity become increasingly important for ICs that have a wide I/O interface.

BRIEF DESCRIPTION OF THE DRAWINGS

The teachings of the embodiments of herein can be readily understood by considering the following detailed description in conjunction with the accompanying drawings.

DETAILED DESCRIPTION OF EMBODIMENTS

Embodiments of the present disclosure relate to a multi-chip package with signal line compression for testing of the multi-chip package. The multi-chip package includes two or more integrated circuits attached to an interposer. The integrated circuits may be, for example, a memory controller device and a memory device. The interposer includes multiple data signal lines for data communications between the two integrated circuits. The data lines are also coupled to one or more test contacts through an interface circuit. The interface circuit is configured such that the number of test contacts is smaller than the number of data lines, which allows a large number of data lines (e.g., more than 100 signal lines) to be tested with a smaller number of test contacts (e.g., 32 test contacts). One additional advantage is that no chip-internal test features are required to enable testing of the package. Since only standardized chip pinouts are involved, the testing can be vendor neutral, enabling multi-sourced package production.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1A:
FIG. 1A illustrates the structure of an assembled multi-chip package, according to an embodiment.

FIG. 1A illustrates an assembled multi-chip package 100-1, according to one embodiment. Shown is a cross-sectional view of a multi-chip package 100 that includes an interposer 102, a memory controller device 104, and memory device 106. The memory controller 104 and memory device 106 are both attached to the interposer 102 and communicate with each other through data signal lines (not shown) in the interposer 102. The interposer 102 includes an interface circuit (not shown) that connects the data signal lines to one or more test pads (not shown) formed on interposer 102 for use in testing the multi-chip package 100. Additional parts of the assembled multichip package, such as encasings or a secondary interposer are also omitted for clarity.

In one embodiment, the memory device 106 is a stack of through-silicon via (TSV) memory and may include, for example, dynamic random access memory (DRAM), static random access memory (SRAM), or non-volatile memory (NVM). Additionally, the memory controller device 104 is meant to represent any type of integrated circuit that uses a memory controller 104, for example, a central processing unit or graphics processing unit. Throughout the specification, reference will be made to a memory controller device 104 and a memory device 106 as two examples of integrated circuits. In some embodiments, other types of integrated circuits may also be attached to the interposer 102, for example, an application specific integrated circuit (ASIC), a microprocessor, a field programmable gate array (FPGA), programmable logic device (PLD), etc.

Figure 1B:
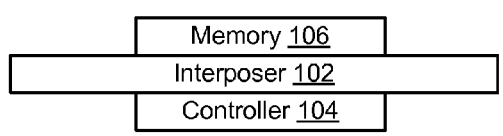
FIG. 1B illustrates the structure of an assembled multi-chip package, according to another embodiment.

FIG. 1B illustrates an assembled multi-chip package 100-2, according to another embodiment. The multi-chip package 100-2 of FIG. 1B includes an interposer 102, a memory controller device 104, and a memory device 106. Unlike the package of FIG. 1A, the memory controller 104 and memory device 106 are now attached to opposite sides of the interposer 102 to form a 3D multi-chip package. The memory controller 104 and memory device 106 still communicate through data signal lines (not shown) in the interposer 102 and interposer 102 still has an interface circuit (not shown) that connects the data signal lines to one or more test contacts (not shown).

Figure 1C:
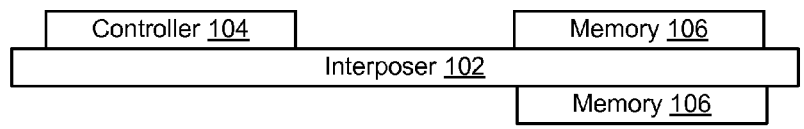
FIG. 1C illustrates the structure of an assembled multi-chip package, according to still another embodiment.

FIG. 1C illustrates an assembled multi-chip package 100-3, according to still another embodiment. The multi-chip package 100-3 includes an interposer 102 and a memory controller device 104. Unlike the package of FIG. 1A, there are now two memory devices 106 each located on opposite sides of the interposer 102 to form a hybrid multi-chip package 100-3. The memory controller 104 and the memory devices 106 still communicate through data signal lines in the interposer 102 (not shown), and interposer 102 still has an interface circuit (not shown) that connects the data signal lines to one or more test contacts (not shown).

Figure 2:
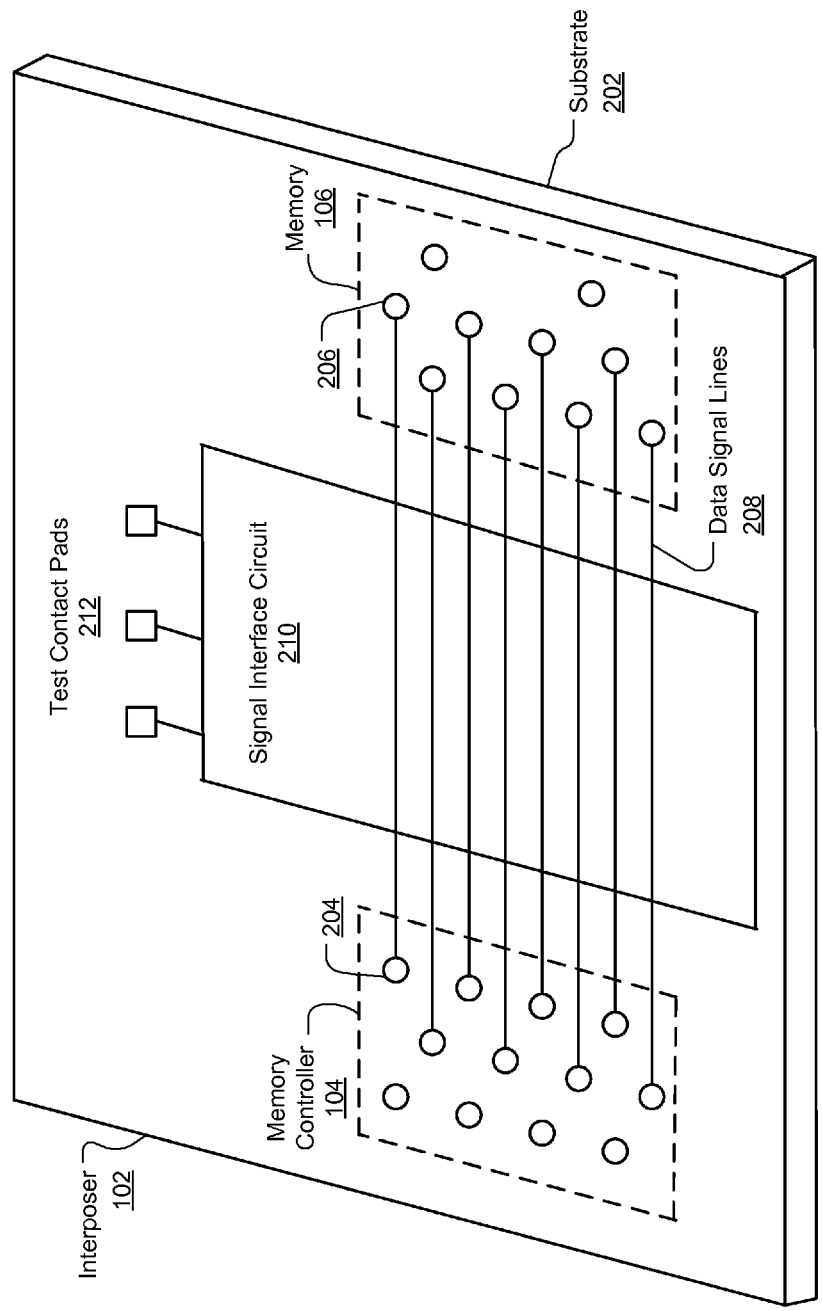
FIG. 2 illustrates an interposer for a multi-chip package, according to an embodiment.

FIG. 2 illustrates an interposer 102 for a multi-chip package, according to an embodiment. Shown in FIG. 2 is a three-dimensional view of an interposer 102 that corresponds to the interposer 102 from FIG. 1A. The interposer 102 includes a substrate 202 that may be comprised of material such as glass or silicon. A set of IC contacts 204 that match the pin-out of a memory controller device 104 is disposed on the surface of the substrate 202. Another set of IC contacts 206 that match the pin-out of a memory device 106 is also disposed on the surface of the substrate 202. The dashed lines surrounding the IC contacts 204, 206 represent the outlines of the memory controller device 104 and the memory device 106 that will be attached (e.g., with solder) to the interposer 102 during package assembly. In other embodiments, the IC contacts 204 and 206 may be configured to match the pin-outs of other types of ICs.

Some of the contacts 204 for the memory controller and contacts 206 for the memory device are connected through a number of data signal lines 208. When attached to the interposer 102, the memory controller device 104 and memory device 106 send and receive data to each other via the data signal lines 208. The data signal lines 208 may be disposed on the substrate 202, for example, as wires in a conductive layer of the substrate, as vias that run vertically through the substrate, or as wires in a conductive material attached to the substrate. Only eight data signal lines 208 are shown in FIG. 2 for clarity. In other embodiments, the interposer 202 includes a much larger number (e.g., >100) of data signal lines 208. For example, to support wide I/O memory communications, there may be 512 or 1024 data signal lines for carrying data signals in parallel between the memory controller 104 and the memory 106.

The data signal lines 208 are also coupled to one or more test contact pads 212 through a signal interface circuit 210. The test contact pads 212 may be comprised of a conductive material, such as metal, and located on a surface of the substrate 202. The signal interface circuit 210 routes test data signals between the test contact pads 212 and the data signal lines 208 to enable testing of the multi-chip package either before or after final package assembly. Specifically, the signal interface circuit 210 couples each test contact pad 212 to multiple data signal lines 208, thereby reducing the number of test contact pads 212 that are needed to send and receive test patterns across the data signal lines 208 of the multi-chip package. In one embodiment, the number of test contact pads 212 configured to receive test data signals is significantly smaller (e.g., at least 50% less) than the number of data signal lines 208. For example, there may be 512 data signal lines and only 32 test pads, and each test pad 212 is coupled to 16 signal lines through the signal interface circuit 210, resulting in a test pad 212 to data signal line 208 ratio of 1:16.

In one embodiment, external test equipment is used to test the multi-chip package before final package assembly. A memory device 106 is initially attached to the interposer 202 during package assembly. Before a memory controller 104 is attached to the interposer 202, the partially assembled package is tested to determine if it is functioning properly. To test the partially assembled package, external test equipment is coupled to the test contact pads 212, for example, by connecting test probes of the external test equipment to the test contact pads 212. The test equipment drives test patterns into the memory device 106 via the interface circuit 210 and data signal lines 208, which are stored in the memory device 106. The test equipment then reads the stored test patterns from the memory 106 and checks the test patterns for errors. Because the memory controller 104 may be much more expensive than the memory 106 and interposer 102, testing the partially assembled package in this manner avoids the wasted cost of attaching the memory controller 104 to a failing package. Additionally, the signal interface circuit 210 facilitates the testing of a large number of signal lines by "compressing" the signal lines into a manageable number of test contacts.

In one embodiment, the test contact pads 212 may also be coupled to contact points outside of the assembled package (not shown) to enable post-assembly testing.

The memory controller device 104 and memory device 106 may also communicate through command and address signal lines (not shown) that are disposed on the substrate 202. Command and address signal lines carry signals such as clock enable, column address strobe, row address strobe, and address signals. In some embodiments, each of the command and address signal lines is connected directly to its own dedicated test pad (not shown), and the test equipment uses these test pads to transmit command and address information when writing test patterns to and reading test patterns from the memory 106. In other embodiments, the command and address signal lines are connected to the signal interface circuit, and the signal interface circuit provides command and address information to the memory 106 when writing to and reading from the memory 106.

In one embodiment, portions of the signal interface circuit 210 may be implemented as transistors in a thin-film transistor (TFT) layer that is located on a surface of the substrate 202. The TFT layer can cover a portion of the substrate or the entire surface of the substrate 202 and be comprised of a material such as silicon on insulator (SOI), amorphous silicon, microchrystalline silicon, polysilicon, organic material, etc. Implementing the signal interface circuit 210 with thin-film transistors helps to minimize the cost of the signal interface circuit 210 and the interposer 102. During manufacturing of the interposer 102, the TFT layer may be attached to a surface of the substrate 202. Alternatively, the TFT layer may be deposited onto a surface of the substrate 202. Exemplary methods for manufacturing a SOI that includes TFTs include separation by implantation of oxygen (SIMOX) or wafer bonding (e.g. via the Smart Cut method).

In another embodiment, portions of the signal interface circuit 210 may be implemented as transistors in an active layer of the substrate 202. In other embodiments, portions of the signal interface circuit 210 may be implemented with an integrated circuit device that is attached to the substrate 202. The integrated circuit device may be capable of executing a test pattern that is programmed into the integrated circuit through the test pads 212. Some examples of integrated circuits supporting this functionality include an application specific integrated circuit (ASIC), a programmable logic array (PLA), programmable array logic (PAL), a field programmable gate array (FPGA), a complex programmable logic device (CPLD) and a programmable logic controller (PLC).

In some embodiments, portions of the signal interface circuit 210, such as TFT transistors, may be attached directly to the signal lines 208. Alternatively, the interface circuit may be connected to the signal lines 208 through conductive wires.

Figure 3:
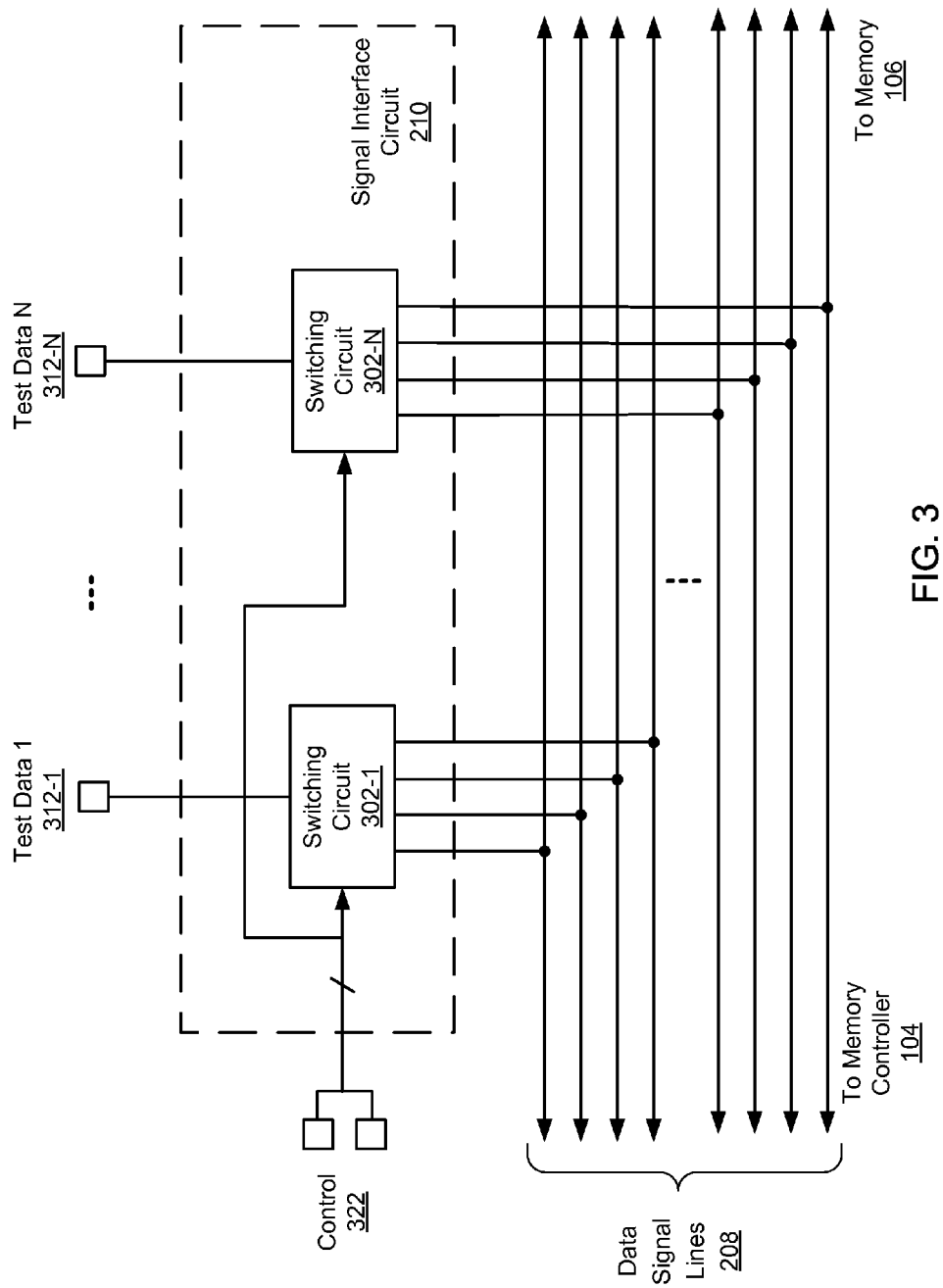
FIG. 3 is a schematic diagram illustrating a signal interface circuit, according to an embodiment.

FIG. 3 is a schematic diagram illustrating the signal interface circuit 210 of FIG. 2, according to one embodiment. The signal interface circuit 210 includes N switching circuits 302 and N test data pads 312, where N is a positive integer. Each switching circuit 302 is coupled to a test data pad 312, one or more control test pads 322, and the data signal lines 208. Specifically, switching circuit 302-1 is coupled to test data pad 312-1, control test pads 322, and multiple data signal lines 208. Switching circuit 302-N is coupled to test data pad 312-N, control pads 322, and multiple data signal lines 208.

In one embodiment, the switching circuits 302 are multiplexing and de-multiplexing circuits that allow for bidirectional transmission of signals between the test data pads 312 and the data signal lines 208. The routing of signals through the switching circuits 302 is controlled by control signals received via the control test pads 322. Each switching circuit 312 receives test data signals from the test data pads 312 and switches the test signals onto one data signal line 208 at a time, as determined by the settings of the control signals 322. Similarly, each switching circuit 302 receives signals from a selected signal line 208 and routes the signal onto the test data pad 312. In one embodiment where the switching circuits 302 include multiplexing and demultiplexing functionality, the switching circuits 302 are implemented with one transistor for each data signal line 208 that either passes or blocks data signals depending on the logic levels of control signals from control test pads 322.

In one embodiment where the switching circuits 302 include multiplexing and de-multiplexing functionality, external test equipment iteratively loads test patterns into the memory 106 via the switching circuits 302. The external test equipment transmits data signals to the switching circuits 302 via the test data pads 312 and controls the routing of the switching circuits via the control pads 322. The test patterns are then iteratively read back from the memory 106 via the switching circuits 302 to verify that the values of the test patterns were correctly written to the memory 106.

In some embodiments, the switching circuits 302 are implemented with transistors in a TFT layer located on the substrate of the interposer. In other embodiments, the switching circuits 302 may be implemented with transistors in an active layer of the substrate or in a separate logic circuit (e.g., an ASIC) that is attached to the substrate. In some embodiments, each switching circuit may be connected to a fewer or greater number of signal lines than that shown in FIG. 3.

Figure 4A:
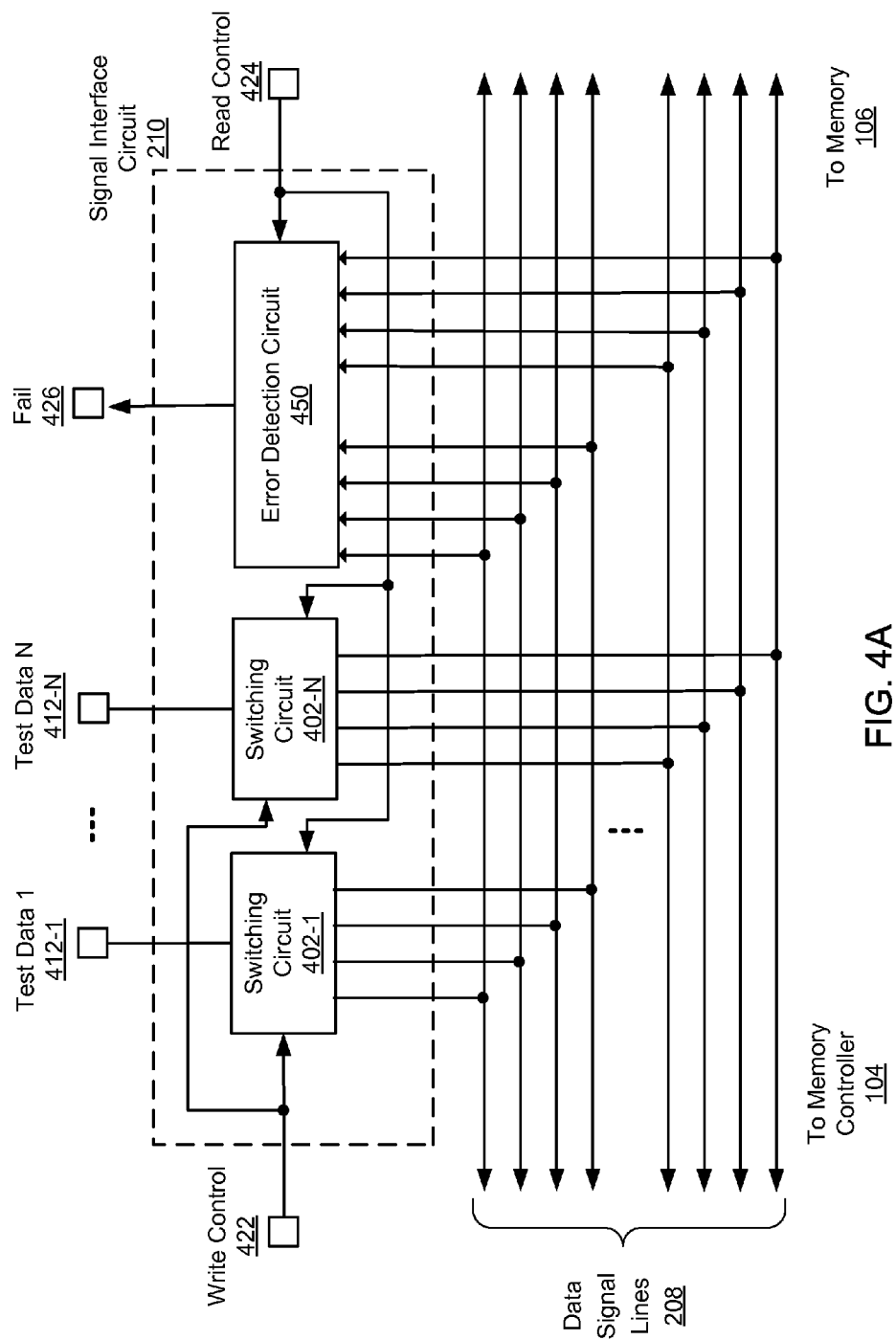
FIG. 4A is a schematic diagram illustrating a signal interface circuit, according to another embodiment.

FIG. 4A is a schematic diagram illustrating a signal interface circuit 210, according to another embodiment. The signal interface circuit 210 includes N switching circuits 402 and N test data pads 412, where N is a positive integer. Each switching circuit 402 is coupled to a test data pad 412, the write control pad 422, the read control pad 424, and signal lines 208. Specifically, switching circuit 402-1 is coupled to test data pad 412-1, write control pad 422, read control pad 424 and multiple data signal lines 208. Switching circuit 402-N is coupled to test data pad 412-N, write control pad 422, read control pad 424 and several signal lines 208.

Figure 4B:
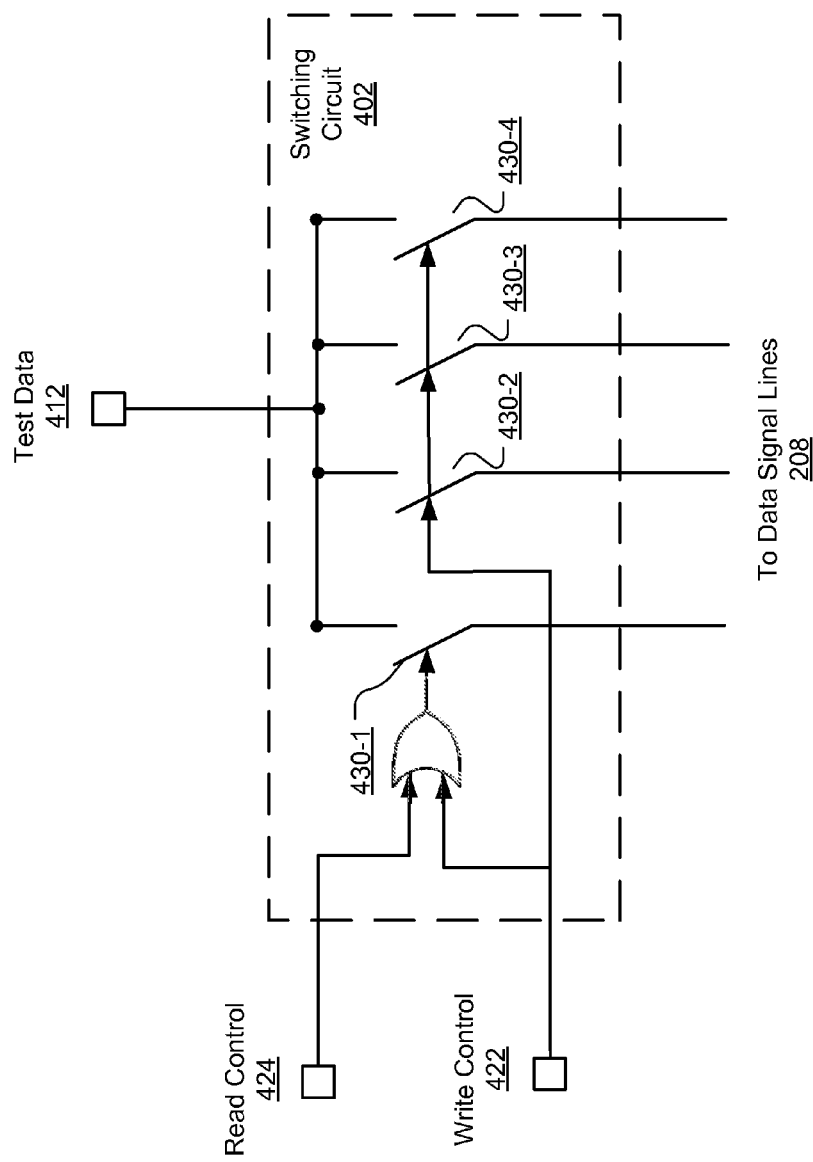
FIG. 4B illustrates a switching circuit shown in FIG. 4A in more detail, according to an embodiment.

In one embodiment, each switching circuit 402 receives test data signals from a test data pad 412 and simultaneously routes the data signals onto all the data signal lines 208 that are coupled to the switching circuit 402. Yet, as described above, the total number of test pads 412 on the interposer 102 is less than the total number of data signal lines 208. Referring to FIG. 4B, illustrated is one embodiment of the switching circuit 402 from FIG. 4A. Switching circuit 402 includes multiple transistor switches 430 and the on/off status of each switch 430 is controlled by a write control signal received from the write control pad 422. When the write control signal is asserted, the switches 430 are closed and test signals are routed from the test data pad 412-1 to each of the data signal lines 208. When the write control signal is not asserted, the switches 430 are open and the connection between the test data pad 412 and the data signal lines 208 is broken.

One of the switches 430-1 is also controlled by a read control signal received from the read control test pad 422. Switch 430-1 is closed when either of the signals from the read control test pad 424 or write control test pad 422 is asserted. When reading back test values from the memory 106, the write control signal may be de-asserted while the read control signal is asserted, which closes switch 430-1 and opens switches 430-2, 430-3 and 430-4. Because only switch 430-1 is closed, signal values are read back from a single data signal line 208 onto the data pad 412. In other embodiments, the switching circuit 402 may not be coupled to the read control pad 424 at all.

Referring back to FIG. 4A, the signal interface circuit 210 also includes an error detection circuit 450. The error detection circuit 450 is coupled to the data signal lines 208 and includes logic (not shown) for verifying the values of test signals that are written to the memory 106. In one embodiment, the error detection circuit 450 receives stored test values from the memory 106 via the signal lines 208 and checks the test values for errors. If an error is detected, the error detection circuit 450 outputs an indication of the error via the fail test pad 426. The error detection circuit 450 may be comprised of, for example, one or more XOR gates that compare the test values for consistency. A separate XOR gate is assigned to each switching circuit 412 to check the test values on a subset of the signal lines 208 that are coupled to that switching circuit 412. The XOR gate outputs one logic level if the signal values are consistent with each other, and outputs a different logic level if the signal values are not consistent to indicate an error.

In one embodiment, the error detection circuit 450 is controlled by a read control signal received from the read control pad 424. When the read control signal is asserted, the error detection circuit 450 is connected to the signal lines 208. When the read control signal is de-asserted, the error detection circuit 450 is disconnected from the signal lines. In one embodiment, the error detection circuit 450 and the switching circuits 402 share the same wire connections to the signal lines 208 instead of having separate connections to the signal lines 208.

In one embodiment, external test equipment loads test patterns into the memory 106 via the switching circuits 402. The external test equipment transmits data signals to the switching circuits 402 via test data contacts 412 and closes the switches of the switching circuits 402 through the write control pad 422. Each switching circuit 402 then routes the test signals to each of the data signal lines 208 connected to the switching circuit 402. The error detection circuit 450 then reads back the test pattern from the memory 106 and checks the test pattern for errors.

In some embodiments, the switching circuits 402 are implemented with transistors in a TFT layer located on the substrate of the interposer. In other embodiments, the switching circuits 402 may be implemented with transistors in an active layer of the substrate or in a separate logic circuit (e.g., an ASIC) that is attached to the substrate. In some embodiments, each switching circuit 402 may be connected to a fewer or greater number of data signal lines 208 than that shown in FIG. 4A.

Figure 5:
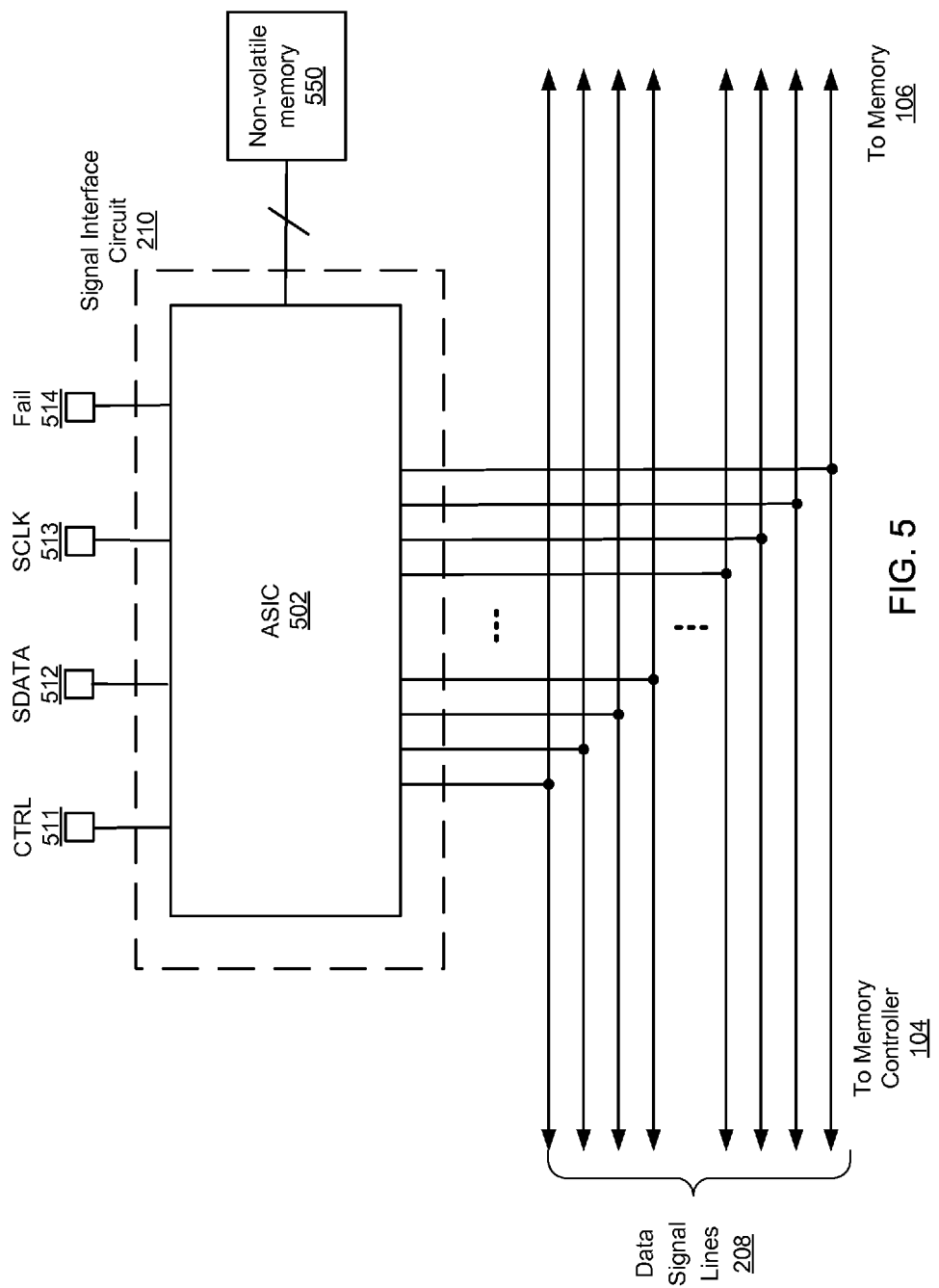
FIG. 5 is a schematic diagram illustrating a signal interface circuit, according to still another embodiment.

FIG. 5 is a schematic diagram illustrating a signal interface circuit 210, according to another embodiment. The signal interface circuit 210 includes an ASIC 502 that is coupled to several test contact pads and the data signal lines 208. The test contact pads include a control test pad 511, a serial data (SDATA) test pad 512, a serial clock test pad 513, and a fail indicator test pad 514. The serial clock test pad 513 receives a clock signal that is used to read serial data from the SDATA test pad 512. The control test pad 511 may be used to for receiving various control signals such as reset and configuration signals.

The ASIC 502 receives test data signals from the SDATA pad 512 and routes the test signals onto the signal lines 208. By receiving the test data through a serial data link, the ASIC 502 reduces the number of test pads even further. The number of test pads also remains relatively constant as the number of data signal lines 208 increases. For example, regardless of whether there are 128 or 1024 signal lines 208, the number of test pads may remain the same. In other embodiments, the ASIC may be replaced with a different type of integrated circuit device, for example, a CPLD or FPGA.

In one embodiment, external test equipment loads test patterns into the ASIC 502 by serially transmitting test data signals to the ASIC 502 via the SDATA pad 512. The ASIC 502 buffers or stores the data signals and then transmits a test pattern to the memory 106 via the signal lines 208. The ASIC 502 also reads the stored test patterns from the memory 106 and checks the test patterns for errors. If an error is detected, the ASIC 502 outputs an indication of the error via the fail test pad 514. In other embodiments, the indication of an error may be output as serial data via the SDATA pad 512.

In one embodiment, the ASIC 502 is reused multiple times in different package tests. The ASIC 502 is temporarily attached to the package during testing and removed from the package once the testing is complete. The final assembled package thus includes unconnected IC contact pads that match a pinout of the ASIC 502, but the final assembled package does not include the ASIC 502 itself. Some of the unconnected IC contact pads are connected to the test pads (e.g., 511, 512, 513) through wires in the interposer. However, because the ASIC 502 is not attached to the interposer, the test pads (e.g., 511, 512, 513) are electrically isolated from the data signal lines 208.

The ASIC 502 may also be coupled to one or more command and address signal lines (not shown) for providing read and write commands to the memory 106. In one embodiment, the ASIC 502 includes a state machine that generates memory addresses for writing test patterns to and reading test patterns from the memory 106. Alternatively, the ASIC 502 may receive the address information as serial data via the SDATA test pad 512.

Also shown in FIG. 5 is a non-volatile memory 550 coupled to the ASIC 502. After testing the multi-chip package, the ASIC 502 may store various types of information in the non-volatile memory 550 that describe errors detected during testing. For example, the error information may include failing memory addresses of the memory device 106 (e.g., row address 011011100000). The error information may also include speed bin information that specifies a safe operational speed for the memory device 106 (e.g., 200-300 MHz maximum speed), memory access latencies, or other memory timing parameters. This information may later be retrieved by the memory controller 104 or other components in the system to avoid errors when using the assembled multi-chip package. In one embodiment, the non-volatile memory 550 may be a serial presence detect (SPD) device.

Figure 6:
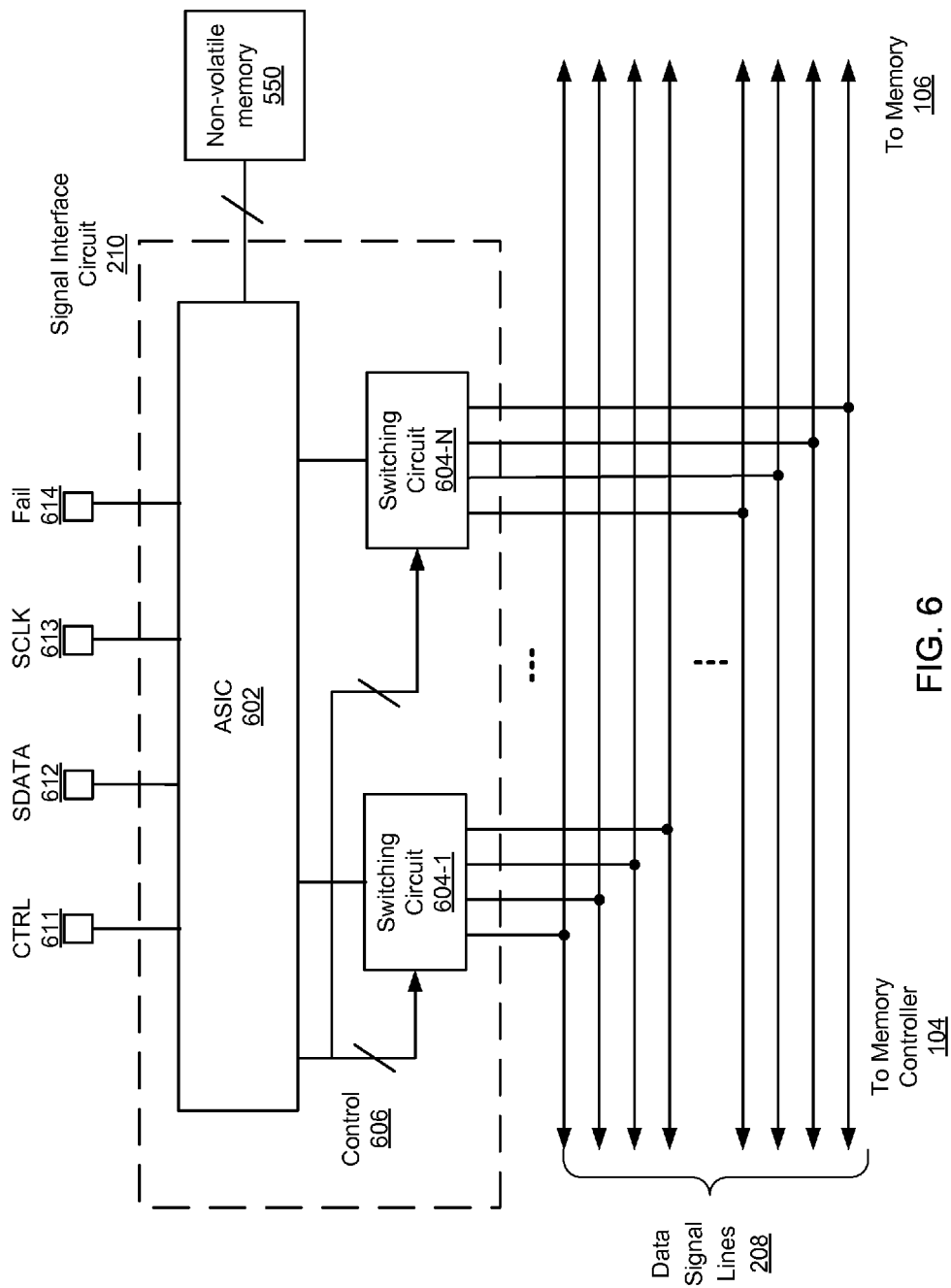
FIG. 6 is a schematic diagram illustrating a signal interface circuit, according to still another embodiment.

FIG. 6 is a schematic diagram illustrating a signal interface circuit 210, according to still another embodiment. FIG. 6 is similar to FIG. 5 but now the signal interface circuit 210 includes several switching circuits 604 coupled between the ASIC 602 and the signal lines 208. In one embodiment, the switching circuits 604 may be multiplexing and de-multiplexing circuits that are similar to those explained in conjunction with FIG. 3. Alternatively, the switching circuits 604 may be similar to the switching circuits explained in conjunction with FIGS. 4A and 4B.

The ASIC 602 controls the operation of the switching circuits 604 through one or more control signals 606. For example, the control signals 606 may include mux control signals, write control signals, or read control signals. The ASIC 602 also transmits test patterns to and reads back the stored test patterns from the memory 106 via the switching circuits 604. The addition of the switching circuits 604 reduces the pin count of the ASIC 602, which is particularly beneficial when the interposer includes a large number of data signal lines 208.

In one embodiment, the switching circuits 604 may be implemented with transistors in a TFT layer located on the substrate of the interposer. Alternatively, the switching circuits 604 may be implemented with transistors in an active layer of the substrate.

Embodiments of the interposer disclosed herein facilitate the testing of multi-chip packages. The signal interface circuit reduces the number of test contacts that are needed to test a large number of signal lines, making it more manageable to test a large number of signal lines with external test equipment. As a result, the multi-chip package may be tested before final assembly to avoid the wasted cost of attaching expensive components to a failing package or after final assembly to identify failing packages.

Upon reading this disclosure, those of skill in the art will appreciate still additional alternative designs for a multi-chip package and interposer with signal line compression. For example, the interposers 102 of FIGS. 1B and 1C may be similar to the interposer 102 disclosed in FIG. 2. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the spirit and scope of the disclosure as defined in the appended claims.

What is claimed is:

1. An interposer comprising:
    a substrate;
    a plurality of data signal lines disposed on the substrate;
    one or more test contact pads disposed on the substrate configured to receive test data signals, the number N of the contact pads being less than the number M of the data signal lines; and
    a signal interface circuit configured to route the test data signals from the one or more contact pads to the plurality of data signal lines.

2. The interposer of claim 1, wherein the signal interface circuit comprises one or more switching circuits for routing the test data signals to the plurality of data signal lines.

3. The interposer of claim 2, wherein at least one of the switching circuits is configured to switch the test data signals between two or more of the data signal lines.

4. The interposer of claim 2, wherein at least one of the switching circuits is configured to route the test data signals to two or more of the data signal lines substantially simultaneously.

5. The interposer of claim 2, wherein the one or more switching circuits are implemented in at least one of a thin film transistor layer located on the substrate or an active layer of the substrate.

6. The interposer of claim 1, wherein the signal interface circuit comprises an integrated circuit device configured to route the test data signals from the one or more contact pads to the plurality of data signal lines.

7. The interposer of claim 6, wherein the interface circuit further comprises one or more switching circuits coupled to the integrated circuit device and the data signal lines, wherein the plurality of switches are controlled by the integrated circuit device for routing the one or more test data signals from the one or more contact pads to the plurality of data signal lines.

8. The interposer of claim 6, wherein the integrated circuit device is configured to read, from an integrated circuit to be coupled to the data signal lines, test values corresponding to the test data signals applied to the integrated circuit and to check the test values for errors.

9. The interposer of claim 8, further comprising a non-volatile memory disposed on the substrate, the non-volatile memory configured to store information corresponding to an error in the test values detected by the integrated circuit device.

10. The interposer of claim 1, further comprising:
a first plurality of integrated circuit (IC) contacts disposed on the substrate and configured to match a pinout of a first IC; and
a second plurality of IC contacts disposed on the substrate and configured to match a pinout of a second IC;
wherein the plurality of data signal lines connect the first plurality of IC contacts with the second plurality of IC contacts.

11. A multi-chip package comprising:
a memory device;
a memory controller device; and
an interposer including:
a plurality of data signal lines connecting the memory device with the memory controller device;
one or more test contact pads configured to receive test data signals, the number N of contact pads being less than the number M of data signal lines; and
a signal interface circuit configured to route the test data signals from the contact pads to the data signal lines.

12. The package of claim 11, wherein the signal interface circuit comprises one or more switching circuits for routing the one or more test data signals to the plurality of data signal lines.

13. The package of claim 12, wherein at least one of the switching circuits is configured to switch the test data signals between two or more of the data signal lines.

14. The package of claim 12, wherein at least one of the switching circuits is configured to route the test data signals to two or more of the data signal lines substantially simultaneously.

15. The package of claim 12, wherein the one or more switching circuits are implemented in at least one of a thin film transistor layer located on a substrate of the interposer or in an active layer of the substrate of the interposer.

16. The package of claim 11, wherein the signal interface circuit comprises an integrated circuit device configured to route the test data signals from the one or more contact pads to the plurality of data signal lines.

17. The package of claim 16, wherein the signal interface circuit further comprises one or more switching circuits coupled to the integrated circuit device and the signal lines, wherein the plurality of switches are controlled by the integrated circuit device for routing the one or more test data signals from the one or more contact pads to the plurality of data signal lines.

18. The package of claim 16, wherein the memory device stores test values corresponding to the test data signals, and the signal interface circuit further comprises an error detection circuit configured to read the stored test values from the memory device and to check the test values for errors.

19. The package of claim 18, where the interposer further comprises a non-volatile memory, the nonvolatile memory configured to store information corresponding to an error in the test values detected by the integrated circuit device.

20. A multi-chip package comprising:
a memory device;
a memory controller device; and
an interposer including:
a plurality of data signal lines connecting the memory device with the memory controller device;
one or more test contact pads configured to receive test data signals, the number N of contact pads being less than the number M of data signal lines; and
one or more IC contacts that are connected to the one or more test contact pads, the IC contacts configured to match a pinout of an integrated circuit device that routes the test data signals from the one or more contact pads to the plurality of data signal lines.

* * * * *